United States Patent
Pfefferlein

(10) Patent No.: US 11,056,447 B2
(45) Date of Patent: Jul. 6, 2021

(54) POWER MODULE HAVING AT LEAST ONE POWER SEMICONDUCTOR

(71) Applicant: Siemens Aktiengesellschaft, Munich (DE)

(72) Inventor: Stefan Pfefferlein, Heroldsberg (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 0 days.

(21) Appl. No.: 16/635,882

(22) PCT Filed: Jul. 27, 2018

(86) PCT No.: PCT/EP2018/070450
§ 371 (c)(1),
(2) Date: Jan. 31, 2020

(87) PCT Pub. No.: WO2019/025314
PCT Pub. Date: Feb. 7, 2019

(65) Prior Publication Data
US 2020/0381370 A1    Dec. 3, 2020

(30) Foreign Application Priority Data
Aug. 3, 2017  (EP) ..................... 17184760

(51) Int. Cl.
*H01L 23/00*    (2006.01)
*H01L 21/56*    (2006.01)
(Continued)

(52) U.S. Cl.
CPC ............ *H01L 23/564* (2013.01); *H01L 21/56* (2013.01); *H01L 23/31* (2013.01); *H01L 23/5386* (2013.01); *H05K 5/064* (2013.01)

(58) Field of Classification Search
CPC ... H01L 23/564; H01L 23/31; H01L 23/5386; H01L 21/56; H01L 23/00; H01L 23/538;
(Continued)

(56) References Cited

U.S. PATENT DOCUMENTS

| | | |
|---|---|---|
| 5,583,378 A | 12/1996 | Marrs et al. |
| 2002/0173192 A1 | 11/2002 | Heilbronner |

(Continued)

FOREIGN PATENT DOCUMENTS

| | | |
|---|---|---|
| CN | 1945818 A | 4/2007 |
| CN | 102201449 A | 9/2011 |

(Continued)

OTHER PUBLICATIONS

Lostetter A B et al: "Integrated Power Modules (IPMS), a Novel MCM Approach to High Power Electronics Design and Packaging", International Journal of Microcircuits and Electronic Packaging, International Microelectronics & Packaging Society, US, vol. 21, No. 3, pp. 274-278, XP000802486, ISSN: 1063-1674, Figure 3; 1998.

(Continued)

*Primary Examiner* — Alexander O Williams
(74) *Attorney, Agent, or Firm* — Henry M. Fereisen LLC

(57) ABSTRACT

A power module includes a substrate having a first layer and a second layer which are connected to one another and arranged above one another. The first layer includes a first dielectric material having a metallization arranged on a side facing the second layer and the second layer includes a second dielectric material having a metallization arranged on a side facing away from the metallization of the first dielectric material. A power semiconductor having a first contact area and a second contact area opposite the first contact area is connected to the metallization of the first dielectric material via the first contact area and arranged in (Continued)

a first recess of the second layer. A metallic first encapsulation encapsulates the power semiconductor in a fluid-tight manner, with the second contact area of the power semiconductor being electrically conductively connected to the metallization of the second dielectric material via the first encapsulation.

18 Claims, 5 Drawing Sheets

(51) Int. Cl.
 *H05K 5/06* (2006.01)
 *H01L 23/31* (2006.01)
 *H01L 23/538* (2006.01)

(58) Field of Classification Search
 CPC ............... H01L 23/49833; H01L 24/82; H01L 23/5389; H01L 23/13; H01L 24/24; H01L 23/3735; H01L 25/07; H01L 25/072; H01L 2224/73267; H01L 224/24101; H01L 2224/24227; H01L 2224/73259; H01L 2224/92224; H01L 2224/92244; H01L 2224/245; H01L 2224/24101; H05K 5/064
 USPC .......................................................... 257/690
 See application file for complete search history.

(56) References Cited

U.S. PATENT DOCUMENTS

| | | | |
|---|---|---|---|
| 2005/0083655 A1* | 4/2005 | Jairazbhoy | H01L 23/473 361/699 |
| 2007/0076390 A1 | 4/2007 | Kroener et al. | |
| 2009/0189291 A1* | 7/2009 | Landau | H01L 24/83 257/777 |
| 2010/0157568 A1* | 6/2010 | Ewe | H01L 23/49827 361/820 |
| 2013/0161801 A1* | 6/2013 | Otremba | H01L 23/3735 257/668 |
| 2014/0117531 A1 | 5/2014 | Mahler et al. | |
| 2014/0268780 A1* | 9/2014 | Wang | F21S 4/22 362/249.06 |
| 2015/0305210 A1 | 10/2015 | Yu et al. | |
| 2016/0104697 A1* | 4/2016 | Cho | H01L 23/5386 257/195 |
| 2016/0379955 A1 | 12/2016 | Liu et al. | |
| 2017/0207160 A1* | 7/2017 | Gowda | H01L 25/16 |
| 2017/0287853 A1* | 10/2017 | Kim | H01L 23/49822 |
| 2017/0316994 A1* | 11/2017 | Hoegerl | H01L 23/051 |
| 2018/0122720 A1* | 5/2018 | Hable | H01L 24/48 |
| 2018/0145045 A1* | 5/2018 | Zundel | H01L 24/03 |
| 2018/0211917 A1* | 7/2018 | Hoegerl | H01L 23/4334 |
| 2018/0301392 A1* | 10/2018 | Stegmeier | H01L 24/84 |
| 2019/0043734 A1* | 2/2019 | Kapusta | H01L 23/3107 |
| 2019/0378786 A1* | 12/2019 | Hejtmann | H01L 24/19 |

FOREIGN PATENT DOCUMENTS

| | | |
|---|---|---|
| CN | 103327741 A | 9/2013 |
| CN | 103943610 A | 7/2014 |
| CN | 106298549 A | 1/2017 |
| CN | 106601628 A | 4/2017 |
| DE | 10 2013 112 029 A1 | 4/2014 |
| EP | 1 255 299 A2 | 11/2002 |
| WO | WO 03021673 A1 | 3/2003 |

OTHER PUBLICATIONS

PCT International Search Report and Written Opinion of International Searching Authority dated Nov. 14, 2018 corresponding to PCT International Application No. PCT/EP2018/070450 filed Jul. 27, 2018.

* cited by examiner a)

b)

c)

d)

e)

f)

ized as EP 3439028 A1, pursuant to 35 U.S.C. 119(a)-(d).

POWER MODULE HAVING AT LEAST ONE POWER SEMICONDUCTOR

CROSS-REFERENCES TO RELATED APPLICATIONS

This application is the U.S. National Stage of international Application No. PCT/EP20181070450, filed Jul. 27, 2018, which designated the United States and has been published as International Publication No. WO 2019/025314 A1 and which claims the priority of European Patent Application, Serial No. 17184760.1, filed Aug. 3, 2017, published as EP 3439028 A1, pursuant to 35 U.S.C. 119(a)-(d).

BACKGROUND OF THE INVENTION

The invention relates to a power module having at least one power semiconductor, in particular a power transistor, which has a first contact area and a second contact area opposite the first contact area, and a substrate which comprises at least two layers which are connected to one another and arranged above one another.

The invention further relates to a method for producing such a power module.

Such a power module with power semiconductors is used, for example, in a power converter. Conventional power modules are susceptible to the penetration of moisture due to their construction. As a result of the penetration of moisture, corrosion phenomena occur, in particular during operation, for example in the region of field rings of the power semiconductors, and consequently premature failure occurs.

An increase in the susceptibility to moisture on the power semiconductor level and/or a use of power semiconductors with packaging which is less susceptible to moisture are associated with considerable restrictions in the availability of suitable power semiconductors.

Encapsulation with organic potting materials, such as, for example, polymers, is susceptible to further environmental influences, such as, for example, radiation or aggressive substances which damage or even decompose the potting material.

In addition, a low-inductance connection of the power semiconductors is required in order to enable a sufficiently fast switching speed of the power semiconductors and therefore a high efficiency. In particular, bonding wires are responsible for parasitic inductances which cause overvoltages and increase switching losses.

Unexamined patent application DE 10 2013 112 029 A1 describes a semiconductor component with an encapsulation which comprises inorganic particles, for example glass.

Unexamined patent application EP 1 255 299 A2 describes a power semiconductor module consisting of a housing, a ceramic substrate, structured and electrically conductive contact areas arranged thereon in a circuit-compatible manner, components arranged thereon, a pressure contact consisting of a flexible pressure accumulator and a pressure plate generating the pressure, and power and control connections. Modified methods of construction technologies for the individual components are a compulsory prerequisite in order to increase the performance, reliability and service life while at the same time reducing production costs. This is achieved by way of a flexible conductor plate which connects the components to one another in a circuit-compatible manner and/or to the contact areas of the substrate, wherein a flexible insulating material is introduced in order to insulate the components from one another.

Unexamined patent application US 2007/0076390 A1 describes a power semiconductor module comprising a controllable semiconductor chip that is connected in a bond wire-free manner, a first printed circuit board, a second printed circuit board, and one or more passive component(s).

The publication "Integrated Power Modules (IPMs), A Novel MCM Approach to High Power Electronics Design and Packaging" describes an integrated power module having a multi-layer topology design, which expands the concept of the multichip modules (MCM) on high-power electronic assemblies.

The invention is based on the object of providing a power module comprising at least one power semiconductor, which offers higher resistance to moisture compared to the prior art and enables a low-inductance planar connection of the at least one power semiconductor.

SUMMARY OF THE INVENTION

This object is inventively achieved by a power module having at least one power semiconductor, in particular a power transistor, which has a first contact area and a second contact area opposite the first contact area, and a substrate, which comprises at least two layers connected to one another and arranged above one another, wherein the first layer comprises a first dielectric material having at least one first metallization, wherein the first metallization is arranged on a side facing the second layer, wherein the second layer comprises a second dielectric material having at least one second metallization, wherein the second metallization is arranged on a side facing away from the first metallization, wherein the power semiconductor is connected to the first metallization by way of the first contact area, wherein the power semiconductor is arranged in a first recess of the second layer, wherein a metallic first encapsulation is arranged in such a way that the power semiconductor is encapsulated in a fluid-tight manner, and the second contact area of the power semiconductor is electrically conductively connected to the second metallization by way of the first encapsulation.

Furthermore, this object is inventively achieved by a method for producing such a power module, wherein the first contact area of the power semiconductor is electrically conductively connected to the first metallization of the first layer, then the second layer, which has a first recess around the power semiconductor, is connected to the first layer, then a metallic first encapsulation is arranged in such a way that the power semiconductor is encapsulated in a fluid-tight manner and the second contact area of the power semiconductor is electrically conductively connected to the second metallization by way of the first encapsulation.

The advantages and preferred embodiments cited below with respect to the power module can be analogously transferred to the production method.

The invention is based on the consideration of inorganically encapsulating the power semiconductors in a power module in order to achieve improved resistance to moisture and other environmental influences. Furthermore, the power semiconductors are to be connected to a substrate by way of a first contact area and a second contact area opposite the first contact area in a low-inductance manner in order to achieve a high degree of efficiency. The substrate has at least two layers, which are connected to one another, in particular cohesively, wherein one layer has recesses into which at least one power semiconductor is inserted in each case. A potting chamber, which is open in a direction over the recesses, is produced by way of an, in particular cohesive, connection of the layers, which surrounds the power semiconductor in particular in an annular manner. For example, the layers are designed as a direct copper bonding substrate, a DCB substrate for short, which has a ceramic plate on which a metallization, in particular a copper metallization, is laminated with very high adhesive strength. The power semiconductors, for example transistors or diodes, are in particular flipped and fitted with the first contact area, the actual chip top side, on the DCB substrate, with the power semiconductors being sintered or soldered onto the metallization of the layer. Such a connection has a significantly lower parasitic inductance than a bonding wire connection and is therefore less lossy. Establishing electrical contact with the second contact area, the actual chip underside, is carried out by way of a first encapsulation, which is designed in particular as a metal deposition and runs at least over the power semiconductor and the, in particular, surrounding, metallization. In particular, the encapsulation is cohesively connected to the metallization such that the respective power semiconductor is encapsulated in a fluid-tight manner by the first encapsulation above the recess. In addition, the second contact area of the power semiconductor is electrically contacted by way of the first encapsulation in a low-inductance and therefore low-loss manner.

In a preferred embodiment, the first encapsulation is produced by way of an additive manufacturing method. In particular, the first encapsulation is applied directly locally by way of an additive metal deposition, for example by thermal metal spraying. The first encapsulation is produced, for example, from copper, silver, tin and/or aluminum and is connected in a fluid-tight manner with the aid of the additive manufacturing method, as a result of which high resistance to liquids and atmospheric humidity is achieved. The additive manufacturing method offers great flexibility in respect of shape, thickness and material of the encapsulation. Furthermore, the encapsulation after fitting, in particular in comparison with individually adapted and soldered lids made of metal sheets, is easy and inexpensive to produce.

In a further advantageous embodiment, an electrically insulating potting material is arranged in the first recess. The potting material has, in particular, an elastic temperature-resistant plastics material, for example an underfill, so the structure is not destroyed by different thermal expansion coefficients of the power semiconductor and of the substrate. For example, an epoxy-based plastics material is used in order to achieve good insulation properties.

The first layer particularly advantageously comprises a third metallization, which is arranged on a side opposite the first metallization, and/or the second layer comprises a fourth metallization, which is arranged on a side opposite the second metallization. In particular, at least one of the layers is designed as a DCB substrate. As a result of the greater number of metallizations, the supply line lengths shorten, and this leads to a reduction in the parasitic inductances and a reduction in the line losses. Furthermore, the required surface area of the substrate is reduced.

In a further advantageous embodiment the first encapsulation is cohesively connected to the second contact area of the power semiconductor. In particular, the cohesive connection is produced indirectly by way of a solder and/or sintered material. Alternatively, the first encapsulation is directly cohesively connected to the second contact area of the power semiconductor. Parasitic effects, in particular in the case of establishing electrical contact, are considerably reduced by such a cohesive connection. Furthermore, the thermal connection to the substrate is improved such that optimum heat dissipation of the power semiconductor takes place. In particular, a layer made of a solder and/or sintered material, which layer is applied to the second contact area of the power semiconductor before the encapsulation, protects the chip from a kinetic impact energy, which is produced, for example, in the case of an additive metal application of the first encapsulation.

In a preferred embodiment, the second metallization has a circumferential metallization which is arranged around the first recess of the second layer, wherein the first encapsulation is connected in a fluid-tight manner to the circumferential metallization. Establishing optimum electrical and thermal contact with the encapsulation and a maximum reduction of the parasitic inductance are achieved by way of the circumferential metallization. Furthermore, the recess is optimally sealed by the encapsulation.

The first encapsulation extends particularly advantageously at least over the first recess and at least over a part of the circumferential metallization. Manufacturing tolerances are compensated by overlapping the encapsulation with at least one part of the circumferential metallization.

In a further advantageous embodiment, at least one part of the first metallization is electrically conductively connected to at least one part of the second metallization by way of a second encapsulation. The second encapsulation is produced in particular from copper, silver, tin and/or aluminum. For example, a gate transfer is produced by such a connection between the two layers. Such a connection is low in loss and is easy and inexpensive to produce.

In a preferred embodiment, an electrically insulating potting material is arranged in the second encapsulation, and the second recess is closed in a fluid-tight manner by the second encapsulation. Short circuits and overcouplings are prevented by the electrically insulating potting material. In particular, moisture, for example by way of a gate transfer, is prevented from penetrating to the power semiconductor by a fluid-tight encapsulation.

The second encapsulation is particularly advantageously connected to the first metallization by way of a metallic molded part designed in particular as a circular blank. Such a circular blank is produced, for example, from copper or a sintered material, in particular sintered paste. Due to its low resistance and its low inductance, the metallic molded part makes it possible to produce a low-loss connection which can be produced easily and inexpensively.

In a preferred embodiment, the second encapsulation is produced by way of an additive manufacturing method. In particular, the second encapsulation is likewise applied directly locally by way of an additive metal deposition, for example by thermal metal spraying. The additive manufacturing method offers great flexibility in respect of shape, thickness and material of the encapsulation. Furthermore, the encapsulation is easy and inexpensive to produce after fitting, in particular in comparison with individually adapted and soldered lids made of metal sheets.

BRIEF DESCRIPTION OF THE DRAWING

The invention is described and explained in more detail in the following on the basis of the exemplary embodiments illustrated in the figures.

In the drawings.

DETAILED DESCRIPTION OF PREFERRED EMBODIMENTS

Figure 1:
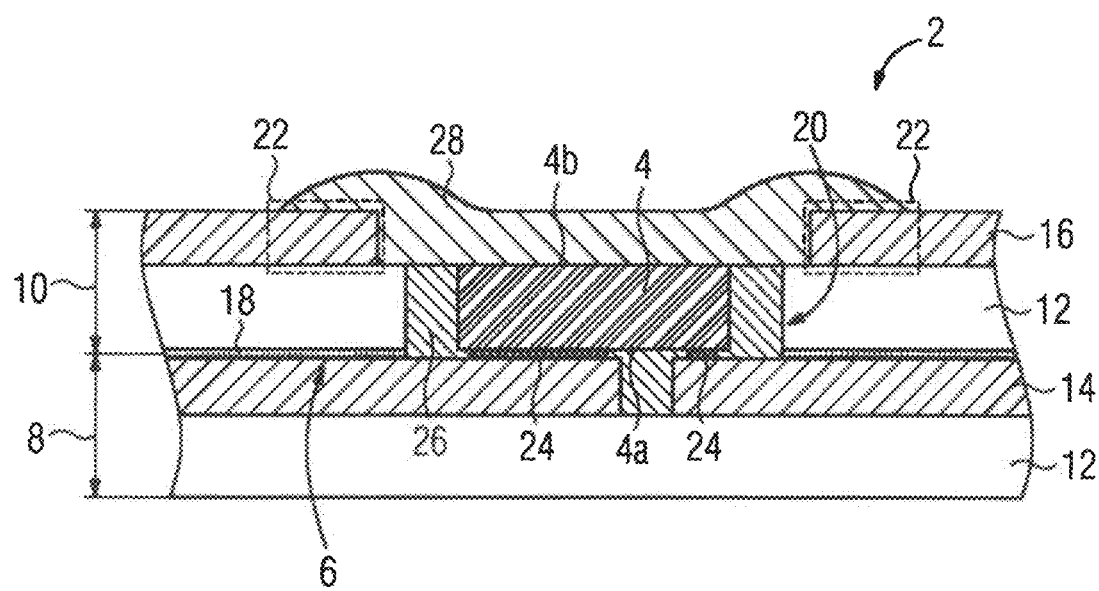
FIG. 1 shows a cross-section of a first embodiment of a power module in the region of a power semiconductor.

Identical reference numerals have the same meaning in the different figures.

FIG. 1 shows a cross-section of a first embodiment of a power module 2 in the region of a power semiconductor 4, which is designed as a power transistor, in particular as a field-effect transistor or as an IGBT. The power semiconductor 4 can alternatively also be designed as a diode and is arranged on a substrate 6. The substrate 6 comprises a first layer 8 and a second layer 10 arranged on the first layer 8. The layers 8, 10 each comprise a dielectric material 12 designed as a ceramic plate, wherein the ceramic plate is produced, for example, from aluminum oxide and/or aluminum nitride having a thickness of 250 µm to 1 mm. The first layer 8 comprises a first metallization 14 which is connected to the ceramic plate. The second layer 10 comprises a second metallization 16 which is arranged on a side facing away from the first metallization 14. The two layers 8, 10 are connected to one another in a planar manner, in particular full-surface manner, by way of an, in particular adhesive, connection 18. The metallizations 14, 16 are produced, for example, from copper having a thickness of between 150 µm and 750 µm and are structured in such a way that, for example, metallic conductor tracks are formed on the dielectric material 12.

The second layer 10 has a first recess 20, which is also called a cavity and in which the power semiconductor 4 is arranged. The second metallization 16 of the second layer 10 forms a circumferential metallization 22 around the edge of the first recess 20. The power semiconductor 4 has a first contact area 4a and a second contact area 4b opposite the first contact area 4a. The power semiconductor 4 is flipped with its first contact area 4a by way of a cohesive connection 24 to the first metallization 14. In particular, the cohesive connection 24 is produced by soldering or sintering.

The first recess 20 with the power semiconductor 4 is filled with an electrically insulating potting material 26. The potting material 26 comprises an elastic temperature-resistant plastics material, for example an underfill, so the structure is not destroyed by different thermal expansion coefficients of the power semiconductor 4 and of the substrate 6. For example, epoxy-based plastics material is used to achieve good insulation properties. The patting material 26 runs above the first metallization 14 and at most as far as the second contact area 4b of the power semiconductor 4. Furthermore, the first encapsulation 20 is closed with a metallic first encapsulation 28 in such a way that the power semiconductor 4 is encapsulated in a fluid-tight manner and the second contact area 4b of the power semiconductor 4 is electrically conductively connected to the second metallization 16 of the second layer 10 of the substrate 8 by way of the first encapsulation 28. The first encapsulation 28 is designed as a metal deposition made of copper, sliver, tin and/or aluminum.

Figure 5:
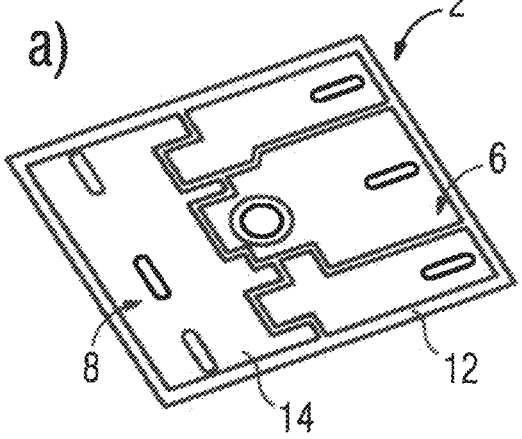
FIG. 5 shows various method steps a) to f) for producing the fourth embodiment of the power module.
Figure 5:
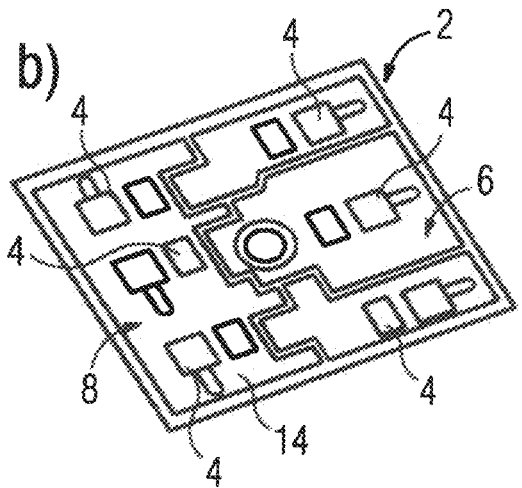
Figure 5:
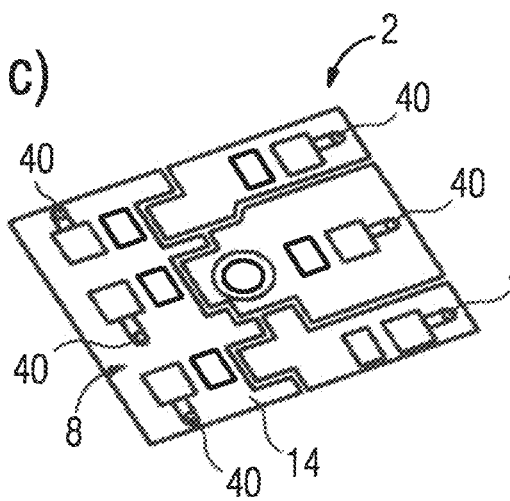
Figure 5:
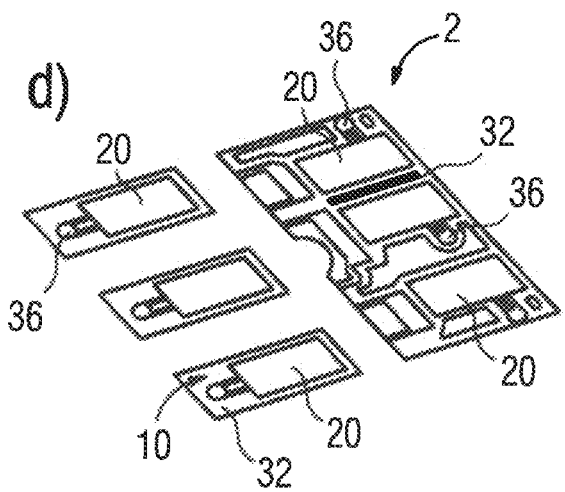
Figure 5:
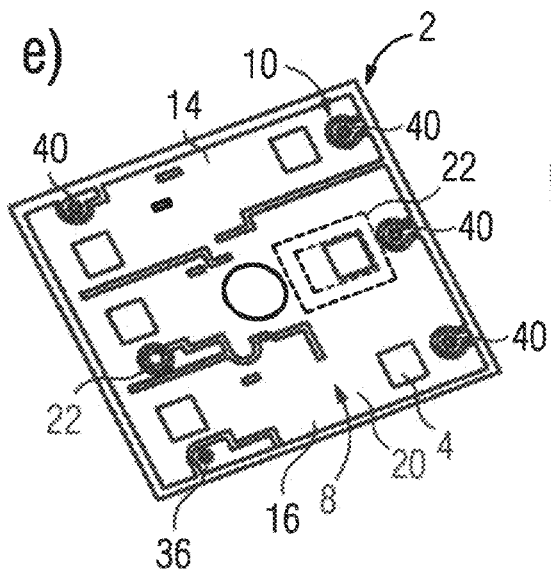
Figure 5:
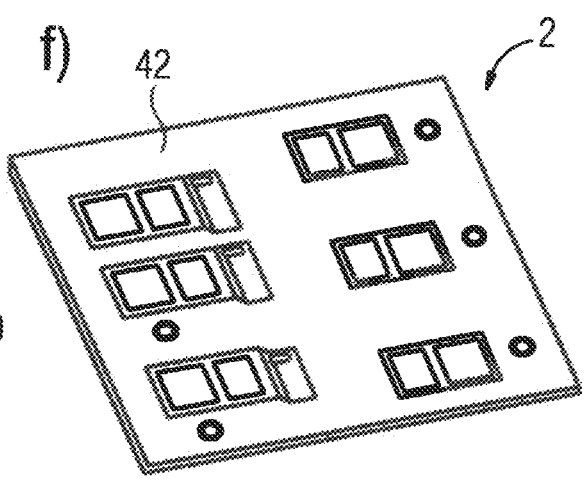

The first encapsulation 28 is produced by way of an additive manufacturing process. In particular, the first encapsulation 28 is applied directly locally by way of additive metal deposition, for example by thermal metal spraying, so the first encapsulation 28 is connected in a fluid-tight manner to the circumferential metallization 22 immediately after production and the first encapsulation 28 is cohesively connected to the second contact area 4b of the power semiconductor 4. For example, the regions of the surface of the substrate 8 that are not to be metallized are covered by a template 42 before the application of the first encapsulation 28 during production. The template 42, which is illustrated in FIG. 5, offers the advantage of precise and, in the process, rapid production. As an alternative to additive metal deposition, the first encapsulation 28 is connected in a fluid-tight manner after production to the circumferential metallization 22, in particular by soldering.

Figure 2:
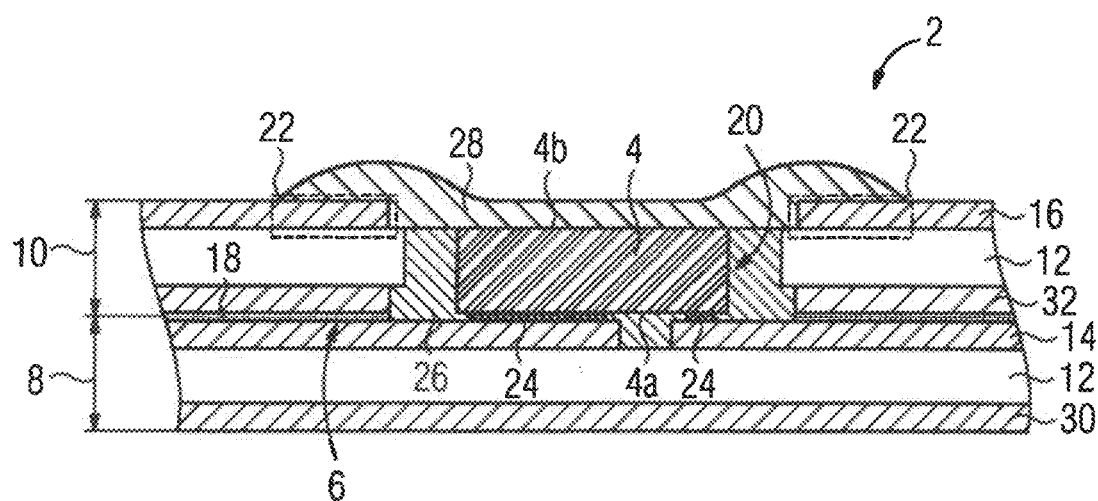
FIG. 2 shows a cross-section of a second embodiment of a power module in the region of a power semiconductor.

FIG. 2 shows a cross-section of a second embodiment of a power module 2 in the region of a power semiconductor 4. The layers 8, 10 of the substrate 6 are each designed as a direct copper bonding substrate, DCB substrate for short, and each comprise a dielectric material 12 designed as a ceramic plate. The first layer 8 comprises a first metallization 14 which is connected to the ceramic plate and a third metallization 30 which is connected to the ceramic plate on an opposite side. The second layer 10 comprises a second metallization 16 which is connected to the ceramic plate and a fourth metallization 32 which is connected to the ceramic plate on an opposite side. The first metallization 14 of the first layer 8 is connected in a planar and electrically conductive manner to the fourth metallization 32 of the second layer 10. In particular, the connection 18 of the layers 8, 10 is produced by soldering or sintering. The metallizations 14, 16, 30, 32 are produced, for example, from copper having a thickness of between 150 µm and 750 µm and is structured in such a way that, for example, metallic conductor tracks are formed on the dielectric material 12. The further embodiment of the power module 2 in FIG. 2 corresponds to the configuration in FIG. 1.

Figure 3:
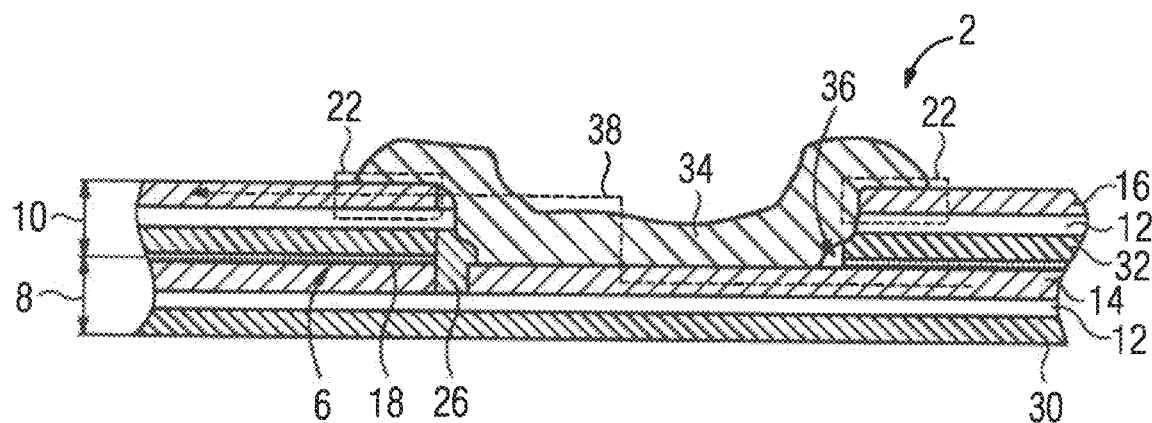
FIG. 3 shows a cross-section of a third embodiment of a power module in the region of a connection between two layers.

FIG. 3 shows a cross-section of a power module 2 in the region of a connection between two layers 8, 10. The connection, which connects a part of the first metallization 14 to at least a part of the second metallization 16, is produced directly by a second encapsulation 34, designed as a metal deposition, in a second recess 36 of the second layer 10 and enables a current flow 38 from, for example, the first metallization 14 to the second metallization 16. Parts of the second recess 36 are filled with a potting material 26 in order to prevent overcouplings or a short circuit during the application of the metal deposition. The further embodiment of the power module 2 in FIG. 3 corresponds to the configuration in FIG. 2.

Figure 4:
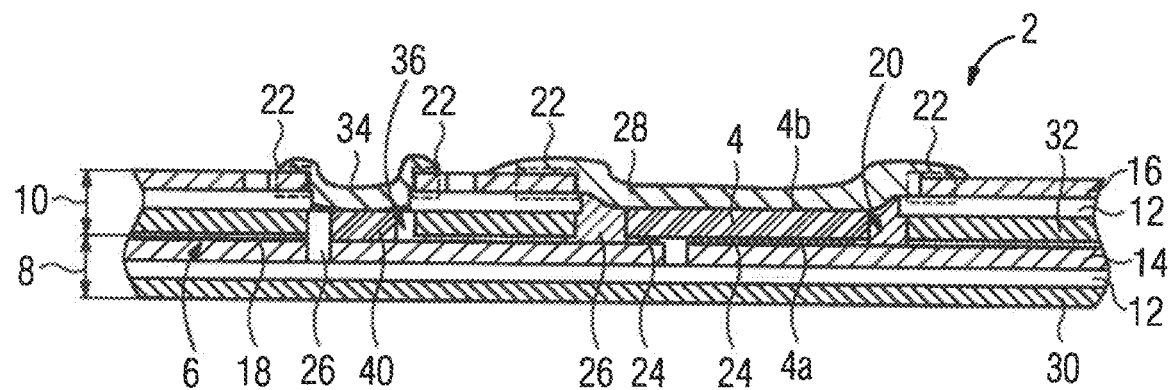
FIG. 4 shows a cross-section of a fourth embodiment of a power module in the region of a power semiconductor.

FIG. 4 shows a cross-section of a fourth embodiment of a power module 2 in the region of a power semiconductor 4, which is designed as a power transistor. A part of the first metallization 14, which is exemplarily connected in an electrically conductive manner to the gate of the power transistor, is electrically conductively connected to a part of the second metallization 16 by way of a metallic molded part 40 and a second encapsulation 34. The metallic molded part 40 is designed as a circular blank and is produced in particular from copper or a sintered material, in particular sintered paste. The circular blank is arranged in a second recess 36 of the second layer 10, with the second recess 36 being adapted to the cylindrical geometry of the circular blank. A minimum distance between the metallizations 16, 32 of the second layer 10 is necessary in order to avoid overcouplings. The second recess 36 is filled with the electrically insulating potting material 26 of the first recess 20 in order to prevent a short-circuit and/or an overcoupling. The potting material 26 in the second recess 36 runs above the first metallization 14 and at most as far as the upper edge of the circular blank. The circular blank is connected to the second encapsulation 34, with the second recess 36 being closed in a fluid-tight manner by the second encapsulation 34. The further embodiment of the power module 2 in FIG. 4 corresponds to the configuration in FIG. 2.

FIG. 5 shows various method steps a) to f) for producing a power module 2. In method step a), a first layer 8 of a substrate 6 is provided, which has a dielectric material 12 with a metallization 14, 30 on both sides, with at least one first metallization 14 being structured for fitting with components and the cable guide thereof. The substrate 6 is designed as a DCB substrate, with the first layer 8 of the substrate 6 as an alternative being multi-layered in order to simplify the cable guide.

In the subsequent method step b), the substrate 6 is equipped with power semiconductors 4, which are cohesively connected to the first metallization 14. In particular, the power semiconductors 4 are connected to the first metallization 14 by soldering and/or sintering.

Then, in method step c), cylindrical metallic molded parts 40, which are designed as a circular blank, are fitted in that they are cohesively connected to the first metallization 14, for example by soldering and/or sintering. Alternatively, a sintered material, in particular a sintered paste, is already applied in method step b). In this case, a sintered material repository, which is printed in particular to be elevated, replaces the metallic molded part 40. The method steps b) and c) can be interchanged in their chronological order or take place at the same time.

In method step d), a second layer 10 of substrate 8 is provided. The second layer 10 comprises a plurality of plates of the dielectric material 12 with a second metallization 16 and a fourth metallization 32. Alternatively, a large continuous plate is used. In addition, the second layer 10 has recesses 20, 36.

Then, in method step e), the second layer 10 is cohesively connected to the first layer 8, for example by soldering and/or sintering, so the power semiconductors 4 and the cylindrical metallic molded parts 40 are arranged within the respective recesses 20, 36. The recesses 20, 36 of the second layer 10 each have a circumferential metallization 22, by way of which an encapsulation 28, 34 can be connected in an electrically conductive and fluid-tight manner. The method steps d) and e) can alternatively be carried out before one of the method steps b) or c). The power semiconductors 4 and/or the metallic molded parts 40 would then be fitted in the recesses 20, 36 and connected to the first metallization 14.

In method step f), a template 42, which is produced, for example, from a plastics material, is placed on the second layer 10 of the substrate 6, and this makes the recesses 20, 36 with the power semiconductors 4 and the cylindrical metallic molded parts 40 and the circumferential metallizations 22. The template 42 offers the advantage of precise and rapid production. Then, the recesses 20, 36, as seen in FIG. 1, are cast with a potting material 26. Subsequently, encapsulations 28, 34, which are not shown in FIG. 5 for the sake of clarity, are applied such that the power semiconductors 4 and the molded parts 40 are electrically conductively connected to the respective circumferential metallization 22 by way of the encapsulations 28, 34 and the recesses 20, 36 are closed in a fluid-tight manner. The encapsulations 28, 34 are applied directly locally by way of additive metal deposition, with the template 42 ensuring that the metal is connected to the second metallization 16 only in the region of the recesses 20, 36. Alternatively, a metal deposition is carried out on a boundary edge of the respective layers 8, 10. In practice, however, this is more difficult since on a boundary edge a mask by way of a template 42 requires a three-dimensional template 42 which is profiled in a thickness. All regions can be optimally covered with a two-dimensional template over the recesses 20, 36 and the encircling metallizations 22, and this reduces the production costs owing to the short template life. The further embodiment of the power module 2 in FIG. 5 corresponds to the embodiment in FIG. 4.

Figure 6:
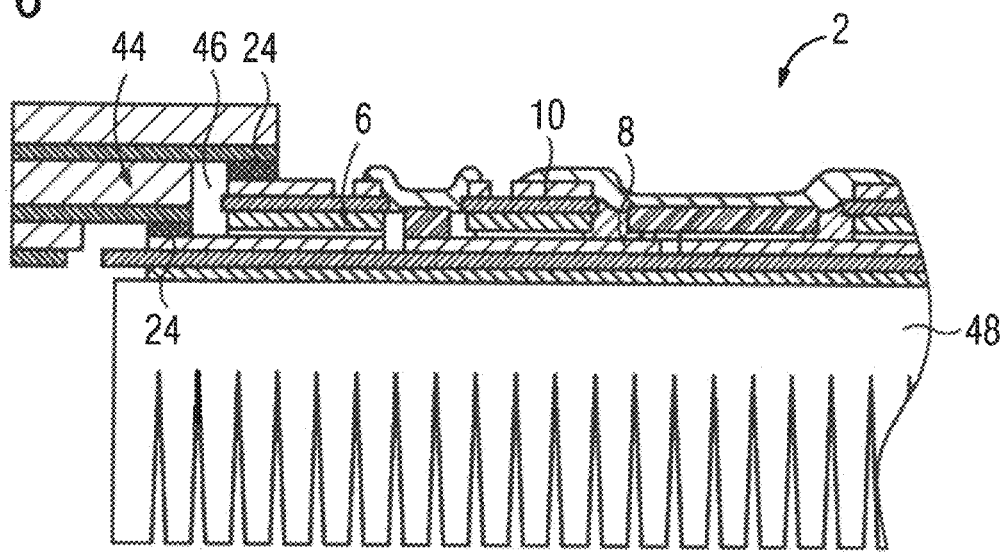
FIG. 6 shows a cross-section of the fourth embodiment of the power module having a first embodiment of establishing contact with a printed circuit board.

FIG. 6 shows a cross-section of the fourth embodiment of the power module 2 with a first embodiment of a configuration on a printed circuit board 44. The layers 8, 10 of the substrate 6 are arranged in a stepped manner. In the region of establishing contact with the substrate 6, the multi-layer printed circuit board 44 is likewise stepped and designed to correspond to the substrate 6, so the printed circuit board 44 is connected with an, in particular cohesive, connection 24, for example a soldered connection or sintered connection, to the substrate 6. Between the connections 24 of the first layer 8 and the second layer 10 with the printed circuit board 44 there is a distance 46 through which air flows in particular in order to prevent overcoupling. The distance 46 is alternatively at least partially filled with a dielectric material having good insulation properties.

The substrate 6 of the power module 2 is thermally conductively connected by way of the first layer 8, in particular over its entire surface, to a heat sink 48, which is produced in particular from aluminum and/or copper and optionally has cooling channels in which a cooling fluid circulates. The further embodiment of the power module 2 in FIG. 6 corresponds to the embodiment in FIG. 4.

Figure 7:
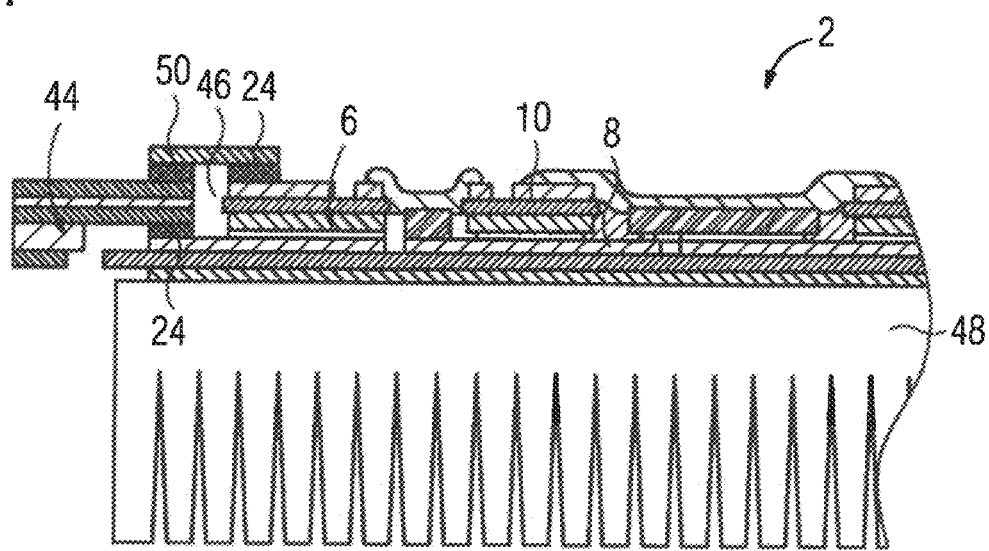
FIG. 7 shows a cross-section of the fourth embodiment of the power module having a second embodiment of establishing contact with a printed circuit board and FIG. 8 shows a cross-section of the fourth embodiment of the power module having a third embodiment of establishing contact with a printed circuit board.

FIG. 7 shows a cross-section of the fourth embodiment of the power module 2 with a second embodiment of establishing contact with a printed circuit board 44. As shown by way of example in FIG. 6, the substrate 6 has two layers 8, 10 which are arranged in a stepped manner towards the printed circuit board 44, with the multi-layer printed circuit board 44, which is likewise of stepped design, being connected directly by way of a metallization, in particular, by way of a cohesive connection 24, to the first layer 8 of the substrate 6. The second layer 10 of the substrate 6 is connected to a further metallization of the printed circuit board 44 by way of a bridge 50, which in particular comprises at least one straight rectangular metal sheet. The further embodiment of the power module 2 in FIG. 7 corresponds to the embodiment in FIG. 6.

Figure 8:
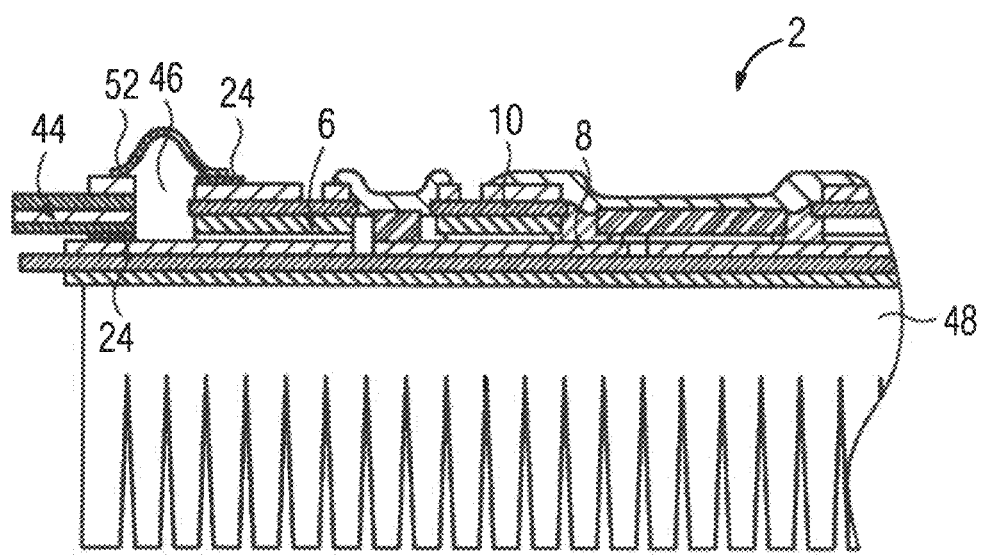

FIG. 8 shows a cross-section of the fourth embodiment of the power module 2 with a third embodiment of establishing contact with a printed circuit board 44. The printed circuit board 44 is directly connected to the first layer 8 of the substrate 6 by way of a metallization. The second layer 10 of the substrate 6 is connected to a further metallization of the printed circuit board 44 by way of a bonding connection 52. The bonding connection 52 comprises at least one bonding wire, which has a round or a rectangular cross-section and is optionally designed as a strip. The at least one bonding wire 52 is produced, for example, from copper, gold or silver. Bonding is carried out, for example, by ultrasonic welding. Alternatively, the bonding wire is soldered in place. The further embodiment of the power module 2 in FIG. 8 corresponds to the embodiment in FIG. 7.

In summary, the invention relates to a power module 2 having at least one power semiconductor 4, in particular a power transistor, which has a first contact area 4a and a second contact area 4b opposite the first contact area 4a, and a substrate 6, which comprises at least two layers 8, 10 connected to one another and arranged above one another. In order to achieve higher resistance to moisture, compared to the prior art, and to enable a low-inductance planar connection of the at least one power semiconductor 4, it is proposed that the first layer 8 comprises a first dielectric material 12 having at least one first metallization 14, wherein the first metallization 14 is arranged on a side facing the second layer 10, wherein the second layer 10 comprises a second dielectric material 12 having at least one second metallization 16, wherein the second metallization 16 is arranged on a side facing away from the first metallization 14, wherein the power semiconductor 4 is connected to the first metallization 14 by way of the first contact area 4a, wherein the power semiconductor 4 is arranged in a first recess 20 of the second layer 10, wherein a metallic first encapsulation 28 is arranged in such a way that the power semiconductor 4 is encapsulated in a fluid-tight manner, and the second contact area 4b of the power semiconductor 4 is electrically conductively connected to the second metallization 16 by way of the first encapsulation 28.

What is claimed is:

1. A power module, comprising:
   a substrate including a first layer and a second layer which is arranged above the first layer, said first and second layers being connected to one another, said first layer comprising a first dielectric material having a metallization arranged on a side facing the second layer, said second layer comprising a second dielectric material having a metallization arranged on a side facing away from the metallization of the first dielectric material; and
   a power semiconductor having a first contact area and a second contact area opposite the first contact area, said power semiconductor being connected to the metallization of the first dielectric material via the first contact area and arranged in a first recess of the second layer; and
   a metallic first encapsulation configured to encapsulate the power semiconductor in a fluid-tight manner, said second contact area of the power semiconductor being electrically conductively connected to the metallization of the second dielectric material via the first encapsulation.

2. The power module of claim 1, wherein the power semiconductor is a power transistor.

3. The power module of claim 1, wherein the first encapsulation is produced by way of an additive manufacturing method.

4. The power module of claim 1, further comprising an electrically insulating potting material arranged in the first recess of the second layer.

5. The power module of claim 1, wherein the first layer comprises a metallization arranged on a side opposite the metallization of the first dielectric material and/or wherein the second layer comprises a metallization arranged on a side opposite the metallization of the second dielectric material.

6. The power module of claim 1, wherein the first encapsulation is cohesively connected to the second contact area of the power semiconductor.

7. The power module of claim 1, wherein the metallization of the second dielectric material has a circumferential metallization, which is arranged around the first recess of the second layer, said first encapsulation being connected in a fluid-tight manner to the circumferential metallization.

8. The power module of claim 7, wherein the first encapsulation is configured to extend over the first recess of the second layer and at least over part of the circumferential metallization.

9. The power module of claim 1, further comprising a second encapsulation, said metallization of the first dielectric material having a part which is electrically conductively connected to at least one part of the metallization of the second dielectric material via the second encapsulation.

10. The power module of claim 9, wherein the second layer includes a second recess, and further comprising an electrically insulating potting material arranged in the second recess of the second layer, with the second recess of the second layer being closed in a fluid-tight manner by the second encapsulation.

11. The power module of claim 9, further comprising a metallic molded part, said second encapsulation being connected to the metallization of the first dielectric material via the metallic molded part.

12. The power module of claim 11, wherein the molded part is configured as a circular blank.

13. The power module of claim 9, wherein the second encapsulation is produced by way of an additive manufacturing method.

14. A method for producing a power module, comprising:
   electrically conductively connecting a first contact area of a power semiconductor to a first metallization of a first layer of a substrate;
   connecting a second layer of the substrate to the first layer of the substrate, with the second layer of the substrate having a first recess around the power semiconductor; and
   arranging a metallic first encapsulation in such a way that the power semiconductor is encapsulated in a fluid-tight manner and a second contact area of the power semiconductor is electrically conductively connected to a second metallization of the second layer via the metallic first encapsulation.

15. The method of claim 14, further comprising:
   providing the second layer with a further metallization on a side opposite the second metallization; and
   filling the first recess with an electrically insulating potting material in such a way that the potting material protrudes beyond the further metallization of the second layer and is sized to extend at most as far as the second contact area of the power semiconductor.

16. The method of claim 14, further comprising electrically conductively connecting part of the first metallization of the first layer to at least one part of the second metallization of the second layer via a second encapsulation by which a second recess of the second layer is closed in a fluid-tight manner.

17. The method of claim 16, further comprising applying at least one of the first and second encapsulations by way of an additive manufacturing method.

18. The method of claim 17, wherein the additive manufacturing method is implemented using a template.

* * * * *